United States Patent
Fujimoto et al.

(10) Patent No.: US 11,205,544 B2
(45) Date of Patent: Dec. 21, 2021

(54) SENSOR

(71) Applicant: KABUSHIKI KAISHA TOSHIBA, Tokyo (JP)

(72) Inventors: Akira Fujimoto, Kawasaki Kanagawa (JP); Hideyuki Tomizawa, Ota Gumma (JP); Naofumi Nakamura, Setagaya Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 100 days.

(21) Appl. No.: 16/815,218

(22) Filed: Mar. 11, 2020

(65) Prior Publication Data
US 2021/0065990 A1    Mar. 4, 2021

(30) Foreign Application Priority Data
Aug. 28, 2019 (JP) .............................. JP2019-155984

(51) Int. Cl.
| | |
|---|---|
| H01G 5/011 | (2006.01) |
| H01G 5/014 | (2006.01) |
| B81B 3/00 | (2006.01) |
| H01G 5/16 | (2006.01) |
| G01P 15/125 | (2006.01) |

(52) U.S. Cl.
CPC ........... *H01G 5/011* (2013.01); *B81B 3/0086* (2013.01); *G01P 15/125* (2013.01); *H01G 5/014* (2013.01); *H01G 5/16* (2013.01); *B81B 2201/0221* (2013.01)

(58) Field of Classification Search
CPC ...... H01G 5/011; H01G 5/014; B81B 3/0086; B81B 2201/0221; G01P 15/125
See application file for complete search history.

(56) References Cited

U.S. PATENT DOCUMENTS

| | | | |
|---|---|---|---|
| 7,027,284 B2* | 4/2006 | Kobayashi | ......... H01H 59/0009 361/278 |
| 2002/0158293 A1* | 10/2002 | Lee | ..................... G01C 19/5755 257/414 |
| 2011/0296917 A1* | 12/2011 | Reinmuth | .............. G01B 7/085 73/514.32 |

(Continued)

FOREIGN PATENT DOCUMENTS

JP    2016-197060 A    11/2016

*Primary Examiner* — David J Bolduc
(74) *Attorney, Agent, or Firm* — Finnegan, Henderson, Farabow, Garrett & Dunner, L.L.P.

(57) ABSTRACT

According to one embodiment, a sensor includes a base body, a first structure body, and a second structure body. The first structure body includes a first fixed portion, a first conductive portion, and first electrodes. The first fixed portion is fixed to the base body. The first conductive portion is held by the first fixed portion. The first conductive portion is separated from the base body in a first direction. The first electrodes are held by the first conductive portion. A distance between the base body and the first electrodes is changeable. The second structure body includes a second conductive portion and second electrodes. The second conductive portion is fixed to the base body. The second electrodes are held by the second conductive portion. One of the second electrodes is between the one of the first electrodes and the other one of the first electrodes.

20 Claims, 4 Drawing Sheets

(56) References Cited

U.S. PATENT DOCUMENTS

| | | | |
|---|---|---|---|
| 2013/0342954 A1* | 12/2013 | Shimanouchi | H01G 5/16 361/290 |
| 2014/0144235 A1* | 5/2014 | Suzuki | B81B 3/0051 73/514.32 |
| 2014/0152325 A1* | 6/2014 | Narita | G01B 7/14 324/662 |
| 2014/0203403 A1* | 7/2014 | Shimanouchi | H01G 5/16 257/532 |
| 2015/0145075 A1* | 5/2015 | Mahameed | B81C 1/00246 257/415 |
| 2016/0202473 A1* | 7/2016 | Uchino | B81C 1/00492 359/221.2 |
| 2016/0293336 A1 | 10/2016 | Fujimoto et al. | |

\* cited by examiner

SENSOR

CROSS-REFERENCE TO RELATED APPLICATIONS

This application is based upon and claims the benefit of priority from Japanese Patent Application No. 2019-155984, filed on Aug. 28, 2019; the entire contents of which are incorporated herein by reference.

FIELD

Embodiments described herein relate generally to a sensor.

BACKGROUND

For example, there is a sensor utilizing a MEMS structure. It is desirable to increase the sensitivity of the sensor. For example, the SNR of the output voltage can be increased by increasing the relative sensitivity.

DETAILED DESCRIPTION

Figure 1A:
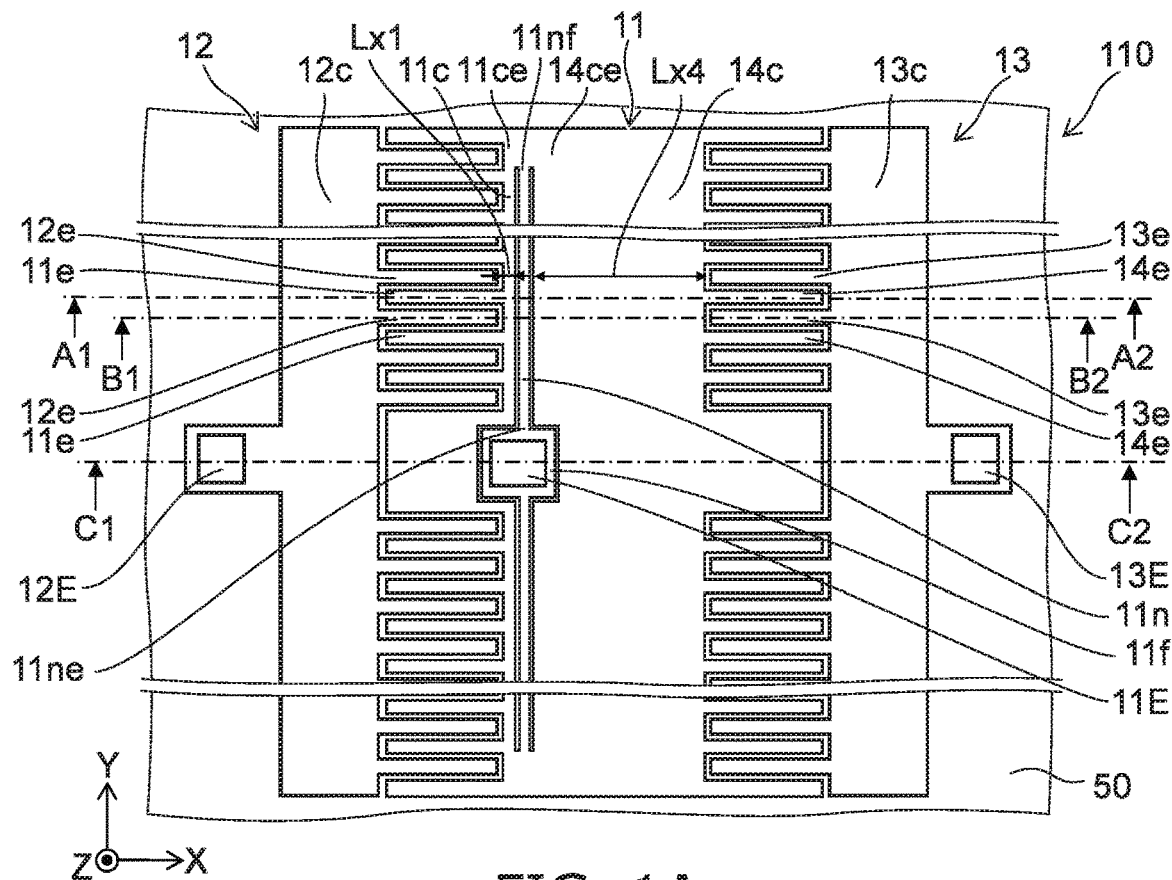
FIG. 1A to FIG. 1C are schematic views illustrating a sensor according to a first embodiment.

According to one embodiment, a sensor includes a base body, a first structure body, and a second structure body. The first structure body includes a first fixed portion, a first conductive portion, and a plurality of first electrodes. The first fixed portion is fixed to the base body. The first conductive portion is held by the first fixed portion. The first conductive portion is separated from the base body in a first direction. The first electrodes are held by the first conductive portion. A distance between the base body and the first electrodes is changeable. A direction from one of the first electrodes toward an other one of the first electrodes is along a second direction crossing the first direction. The second structure body includes a second conductive portion and a plurality of second electrodes. The second conductive portion is fixed to the base body. The second electrodes are held by the second conductive portion. One of the second electrodes is between the one of the first electrodes and the other one of the first electrodes. A first electrode length along the first direction of the one of the first electrodes is shorter than a first conductive portion length along the first direction of the first conductive portion.

According to one embodiment, a sensor includes a base body, a first structure body, and a second structure body. The first structure body includes a first fixed portion, a first conductive portion, and a plurality of first electrodes. The first fixed portion is fixed to the base body. The first conductive portion is held by the first fixed portion. The first conductive portion is separated from the base body in a first direction. The first electrodes are held by the first conductive portion. A distance between the base body and the first electrodes is changeable. A direction from one of the first electrodes toward an other one of the first electrodes is along a second direction crossing the first direction. The second structure body includes a second conductive portion and a plurality of second electrodes. The second conductive portion is fixed to the base body. The second electrodes are held by the second conductive portion. One of the second electrodes is between the one of the first electrodes and the other one of the first electrodes. A second electrode length along the first direction of the one of the second electrodes is shorter than a second conductive portion length along the first direction of the second conductive portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1A to FIG. 1C and FIG. 2 are schematic views illustrating a sensor according to a first embodiment.

Figure 1B:
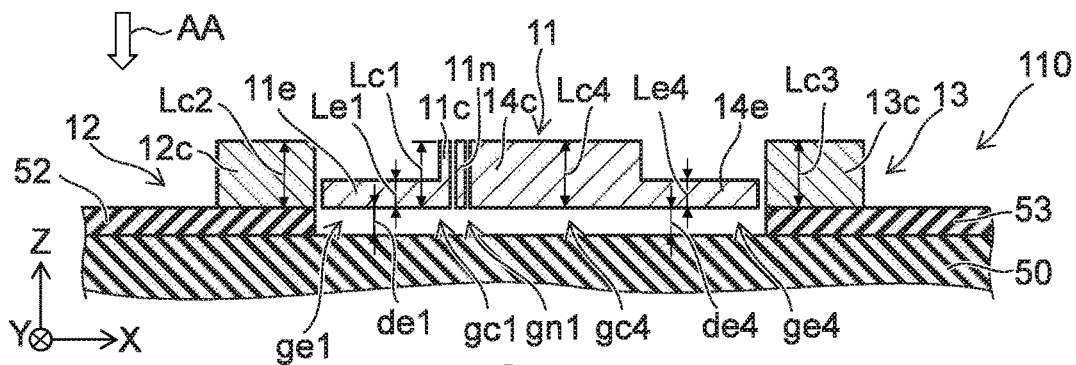
Figure 1C:
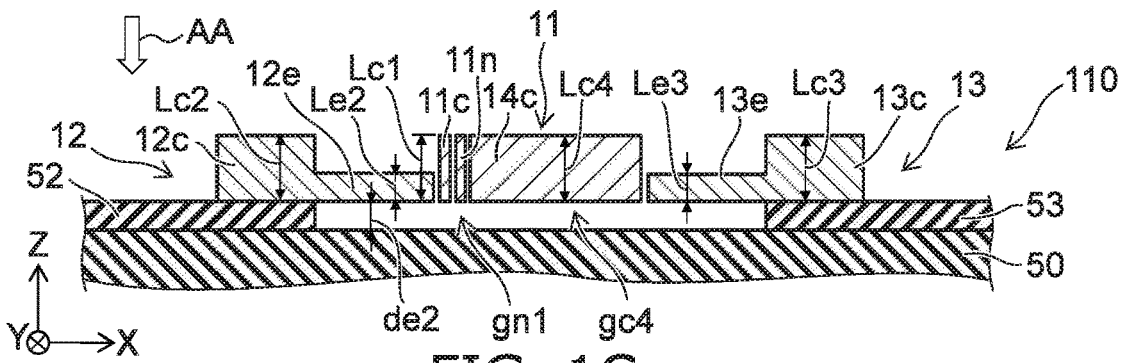
Figure 2:
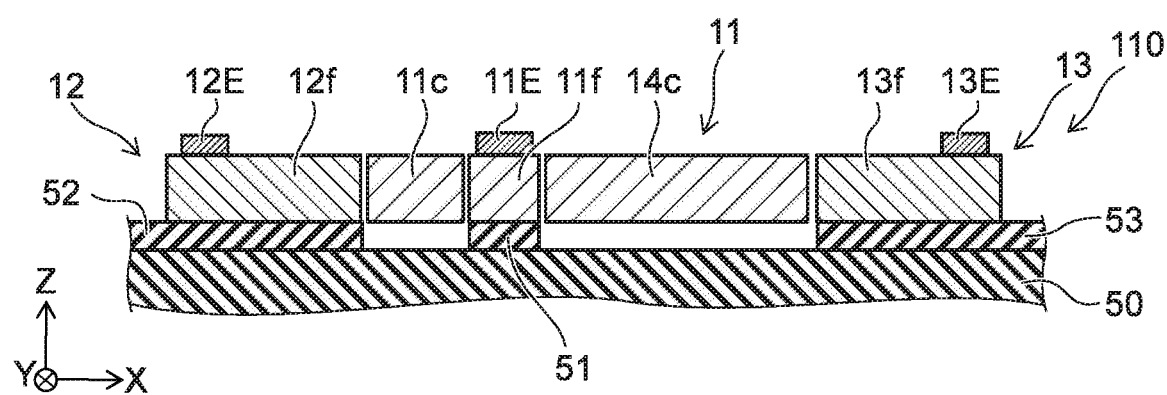
FIG. 2 is a schematic view illustrating the sensor according to the first embodiment.

FIG. 1A is a plan view as viewed along arrow AA of FIG. 1B and FIG. 1C. FIG. 1B is a line A1-A2 cross-sectional view of FIG. 1A. FIG. 1C is a line B1-B2 cross-sectional view of FIG. 1A. FIG. 2 is a line C1-C2 cross-sectional view of FIG. 1A.

As shown in FIG. 1A, the sensor 110 according to the embodiment includes a base body 50, a first structure body 11, and a second structure body 12. The first structure body 11 includes a first fixed portion 11$f$, a first conductive portion 11$c$, and multiple first electrodes 11$e$. In the example as shown in FIG. 2, the sensor 110 further includes a first insulating portion 51 and a second insulating portion 52.

As shown in FIG. 2, the first fixed portion 11$f$ is fixed to the base body 50. In the example, the first insulating portion 51 is provided between the base body 50 and the first fixed portion 11$f$. The first fixed portion 11$f$ is fixed to the base body 50 via the first insulating portion 51.

As shown in FIG. 1A, the first conductive portion 11$c$ is held by the first fixed portion 11$f$. For example, the first conductive portion 11$c$ is connected to the first fixed portion 11$f$. In the example, the first structure body 11 further includes a first connection portion 11$n$. The first fixed portion 11$f$ and the first conductive portion 11$c$ are connected to each other by the first connection portion 11$n$. The first connection portion 11$n$ is, for example, a spring.

As shown in FIG. 1B, the first conductive portion 11$c$ is separated from the base body 50 in a first direction. As shown in FIG. 1B, a gap gc1 is provided between the first conductive portion 11$c$ and the base body 50. For example, the first conductive portion 11$c$ is deformable.

The first direction is taken as a Z-axis direction. One direction perpendicular to the Z-axis direction is taken as an X-axis direction. A direction perpendicular to the Z-axis direction and the X-axis direction is taken as a Y-axis direction. For example, the base body 50 is substantially parallel to the X-Y plane.

As shown in FIG. 1A, the multiple first electrodes 11$e$ are held by the first conductive portion 11$c$. For example, the multiple first electrodes 11$e$ are connected to the first conductive portion 11$c$. As shown in FIG. 1B, a gap ge1 is provided between the base body 50 and the multiple first electrodes 11e. A distance de1 between the base body 50 and the multiple first electrodes 11e (referring to FIG. 1B) is changeable. As shown in FIG. 1A, the direction from one of the multiple first electrodes 11e toward another one of the multiple first electrodes 11e is along a second direction. The second direction crosses the first direction (the Z-axis direction). In the example, the second direction is the Y-axis direction.

As shown in FIG. 1A, the second structure body 12 includes a second conductive portion 12c and multiple second electrodes 12e. As shown in FIG. 1C, the second conductive portion 12c is fixed to the base body 50. For example, the second insulating portion 52 is provided between the base body 50 and the second conductive portion 12c. The second conductive portion 12c is fixed to the base body 50 via the second insulating portion 52. As shown in FIG. 1A, the multiple second electrodes 12e are held by the second conductive portion 12c. For example, the multiple second electrodes 12e are connected to the second conductive portion 12c. One of the multiple second electrodes 12e is between the one of the multiple first electrodes 11e and the other one of the multiple first electrodes 11e. For example, the one of the multiple first electrodes 11e is between the one of the multiple second electrodes 12e and another one of the multiple second electrodes 12e.

As shown in FIG. 1A, the first electrode 11e and the second electrode 12e are arranged alternately along the Y-axis direction. For example, the multiple first electrodes 11e and the multiple second electrodes 12e form a comb electrode.

A capacitance is formed by the multiple first electrodes 11e and the multiple second electrodes 12e. The electrostatic capacitance of the capacitance is dependent on the surface area where the multiple first electrodes 11e and the multiple second electrodes 12e oppose each other.

For example, an acceleration such as an external force or the like is applied to the sensor 110. Due to the acceleration, a portion of the first structure body 11 deforms, and the distance de1 between the base body 50 and the multiple first electrodes 11e changes. On the other hand, a distance de2 between the multiple second electrodes 12e and the base body 50 substantially does not change. Therefore, when the external force such as the acceleration or the like is applied to the sensor 110, the electrostatic capacitance changes from the electrostatic capacitance when the external force such as the acceleration or the like is not applied to the sensor 110. The external force or the like that is applied to the sensor 110 can be detected by detecting the change of the electrostatic capacitance. The sensor 110 is, for example, a MEMS (Micro Electro Mechanical Systems) sensor.

For example, the electrostatic capacitance between the multiple first electrodes 11e and the multiple second electrodes 12e changes according to the change of the distance de1 between the base body 50 and the multiple first electrodes 11e. In the sensor 110, for example, the acceleration along the Z-axis direction is detected.

When the external force such as the acceleration or the like is not applied to the sensor 110, the electrostatic capacitance (an initial capacitance C0) of the sensor 110 is dependent on the surface area where the multiple first electrodes 11e and the multiple second electrodes 12e oppose each other. When the external force such as the acceleration or the like is applied to the sensor 110, the surface area where the multiple first electrodes 11e and the multiple second electrodes 12e oppose each other changes. The electrostatic capacitance at this time is taken as C1 which is the capacitance sensitivity after the change of the surface area. Generally, the capacitance sensitivity C1 of the sensor undergoes voltage conversion by a C-V conversion circuit and is detected as an output voltage. To increase the SNR (Signal-to-Noise Ratio) of the output voltage, it is sufficient to increase the ratio of the capacitance sensitivity C1 to the initial capacitance C0. In the sensor 110, the capacitance sensitivity C1 of the detection is independent of the initial capacitance C0, and is dependent on the displacement amount due to the external force. Therefore, by reducing the initial capacitance C0, the ratio of the capacitance sensitivity C1 to the initial capacitance C0 can be increased, and the SNR can be increased. As a result, high sensitivity is obtained.

In the embodiment as shown in FIG. 1B, for example, the length in the height direction of the multiple first electrodes 11e is set to be short. As shown in FIG. 1C, for example, the length in the height direction of the multiple second electrodes 12e is set to be short. The initial capacitance C0 can be reduced thereby. On the other hand, the capacitance sensitivity C1 does not change. High sensitivity is obtained thereby.

For example, as shown in FIG. 1B, the length along the first direction (the Z-axis direction) of one of the multiple first electrodes 11e is taken as a first electrode length Le1. The length along the first direction of the first conductive portion 11c is taken as a first conductive portion length Lc1. In the embodiment, the first electrode length Le1 is shorter than the first conductive portion length Lc1. Thereby, compared to the case where the first electrode length Le1 is the same as the first conductive portion length Lc1, the surface area where the multiple first electrodes 11e and the multiple second electrodes 12e oppose each other can be small.

For example, as shown in FIG. 1C, the length along the first direction (the Z-axis direction) of one of the multiple second electrodes 12e is taken as a second electrode length Le2. The length along the first direction of the second conductive portion 12c is taken as a second conductive portion length Lc2. In the embodiment, the second electrode length Le2 is shorter than the second conductive portion length Lc2. Thereby, compared to the case where the second electrode length Le2 is the same as the second conductive portion length Lc2, the surface area where the multiple first electrodes 11e and the multiple second electrodes 12e oppose each other can be small.

In the embodiment, the initial capacitance C0 can be reduced. On the other hand, the capacitance sensitivity C1 does not change. A sensor can be provided in which the sensitivity can be increased thereby.

Thus, in the embodiment, the first electrode length Le1 is shorter than the first conductive portion length Lc1. Or, the second electrode length Le2 is shorter than the second conductive portion length Lc2. When forming such a structure, for example, the manufacturing processes are complex. Therefore, generally, the first electrode length Le1 is the same as the first conductive portion length Lc1. The second electrode length Le2 is the same as the second conductive portion length Lc2.

In the embodiment, by considering the higher complexity of the manufacturing processes, etc., the electrode lengths are set to be shorter than the conductive portion lengths. Thereby, the initial capacitance C0 is reduced; and high sensitivity is obtained.

In the embodiment, for example, the first electrode length Le1 is shorter than the second conductive portion length Lc2. For example, the second electrode length Le2 is shorter than the first conductive portion length Lc1.

For example, the first electrode length Le1 may be substantially the same as the second electrode length Le2. The first electrode length Le1 may be not less than 0.9 times and not more than 1.1 times the second electrode length Le2. The manufacturing processes are simple when these lengths are substantially the same.

For example, the first conductive portion length Lc1 may be substantially the same as the second conductive portion length Lc2. The first conductive portion length Lc1 may be not less than 0.9 times and not more than 1.1 times the second conductive portion length Lc2. The manufacturing processes are simple when these lengths are substantially the same.

In the embodiment, the first electrode length Le1 is not less than 1/10 and not more than 9/10 of the first conductive portion length Lc1. Because the first electrode length Le1 is not less than 1/10 of the first conductive portion length Lc1, for example, the effects of the fluctuation of the initial capacitance C0, etc., are suppressed easily. Because the first electrode length Le1 is not more than 9/10 of the first conductive portion length Lc1, for example, the sensitivity is improved easily. For example, the initial capacitance C0 can be reduced stably; and high sensitivity is obtained easily and stably.

In the embodiment, the second electrode length Le2 is not less than 1/10 and not more than 9/10 of the second conductive portion length Lc2. Because the second electrode length Le2 is not less than 1/10 of the second conductive portion length Lc2, for example, the effects of the fluctuation of the initial capacitance C0, etc., are suppressed easily. Because the second electrode length Le2 is not more than 9/10 of the second conductive portion length Lc2, for example, the sensitivity is improved easily. For example, the initial capacitance C0 can be reduced stably; and high sensitivity is obtained easily and stably.

As described above, the first structure body 11 includes the first connection portion 11n as shown in FIG. 1A. The first connection portion 11n connects the first fixed portion 11f and the first conductive portion 11c. As shown in FIG. 1B and FIG. 1C, the first connection portion 11n is separated from the base body 50 in the first direction (the Z-axis direction). As shown in FIG. 1B, a gap gn1 is provided between the first connection portion 11n and the base body 50. For example, the first connection portion 11n is deformable. As shown in FIG. 1A, the first connection portion 11n and the first conductive portion 11c extend along the second direction (e.g., the Y-axis direction). One end portion 11ne of the first connection portion 11n is fixed to the first fixed portion 11f. Another end portion 11nf of the first connection portion 11n is connected to one end portion 11ce of the first conductive portion 11c. In the sensor 110, the first connection portion 11n is a torsion spring.

As shown in FIG. 1A, the sensor 110 may further include a third structure body 13. The third structure body 13 includes a third conductive portion 13c and multiple third electrodes 13e. As shown in FIG. 1B and FIG. 1C, the third conductive portion 13c is fixed to the base body 50. A third insulating portion 53 is provided in the example. The third insulating portion 53 is between the base body 50 and the third conductive portion 13c. The third conductive portion 13c is fixed to the base body 50 via the third insulating portion 53. As shown in FIG. 1A, the multiple third electrodes 13e are held by the third conductive portion 13c. For example, the multiple third electrodes 13e are connected to the third conductive portion 13c.

As shown in FIG. 1A, the first structure body 11 includes a fourth conductive portion 14c and multiple fourth electrodes 14e. The fourth conductive portion 14c is held by the first fixed portion 11f. The fourth conductive portion 14c is connected to the first fixed portion 11f. As shown in FIG. 1B, the fourth conductive portion 14c is separated from the base body 50 in the first direction (the Z-axis direction). For example, a gap gc4 is formed between the fourth conductive portion 14c and the base body 50. For example, the fourth conductive portion 14c is deformable.

The multiple fourth electrodes 14e are held by the fourth conductive portion 14c. For example, the multiple fourth electrodes 14e is connected to the fourth conductive portion 14c. A distance de4 between the multiple fourth electrodes 14e and the base body 50 (referring to FIG. 1B) is changeable. As shown in FIG. 1A, the direction from one of the multiple fourth electrodes 14e toward another one of the multiple fourth electrodes 14e is along the second direction (the Y-axis direction). A gap ge4 is formed between the base body 50 and the multiple fourth electrodes 14e.

As shown in FIG. 1A, one of the multiple third electrodes 13e is between the one of the multiple fourth electrodes 14e and the other one of the multiple fourth electrodes 14e. For example, the one of the multiple fourth electrodes 14e is between the one of the multiple third electrodes 13e and another one of the multiple third electrodes 13e. For example, the multiple third electrodes 13e and the multiple fourth electrodes 14e form a comb electrode. A capacitance is formed by the multiple third electrodes 13e and the multiple fourth electrodes 14e. The electrostatic capacitance of the capacitance is dependent on the surface area where the multiple third electrodes 13e and the multiple fourth electrodes 14e oppose each other.

For example, the distance de4 changes when the acceleration such as the external force or the like is applied to the sensor 110. For example, the distance de4 shortens when the distance de1 lengthens. For example, the distance de4 lengthens when the distance de1 shortens.

As shown in FIG. 1C, the length along the first direction (the Z-axis direction) of one of the multiple third electrodes 13e is taken as a third electrode length Le3. The length along the first direction of the third conductive portion 13c is taken as a third conductive portion length Lc3. In the embodiment, for example, the third electrode length Le3 is shorter than the third conductive portion length Lc3. The electrostatic capacitance (the initial capacitance) that is formed by the multiple third electrodes 13e and the multiple fourth electrodes 14e can be reduced thereby. High sensitivity is obtained thereby.

For example, as shown in FIG. 1B, the length along the first direction (the Z-axis direction) of one of the multiple fourth electrodes 14e is taken as a fourth electrode length Le4. The length along the first direction of the fourth conductive portion 14c is taken as a fourth conductive portion length Lc4. In the embodiment, the fourth electrode length Le4 is shorter than the fourth conductive portion length Lc4. The electrostatic capacitance (the initial capacitance) that is formed by the multiple third electrodes 13e and the multiple fourth electrodes 14e can be reduced thereby. High sensitivity is obtained thereby.

As shown in FIG. 1A, for example, a third direction is taken to be the X-axis direction. The third direction crosses a plane including the first direction and the second direction. The first conductive portion 11c is between the second conductive portion 12c and the third conductive portion 13c in the third direction. The fourth conductive portion 14c is between the first conductive portion 11c and the third conductive portion 13c in the third direction.

As shown in FIG. 1A, the length of the first conductive portion 11c along the third direction (e.g., a direction crossing a plane including the first direction and the second direction, e.g., the X-axis direction) is taken as a first conductive portion width Lx1. The length of the fourth conductive portion 14c along the third direction is taken as a fourth conductive portion width Lx4. The first conductive portion width Lx1 is different from the fourth conductive portion width Lx4. In the example, the first conductive portion width Lx1 is narrower than the fourth conductive portion width Lx4. In the embodiment, the first conductive portion width Lx1 may be wider than the fourth conductive portion width Lx4. By setting the first conductive portion 11c and the fourth conductive portion 14c to be asymmetric, these conductive portions are displaced efficiently when the external force is applied. The change of the electrostatic capacitance can be increased thereby. High sensitivity is obtained easily.

As shown in FIG. 1A, for example, the first connection portion 11n, the first conductive portion 11c, and the fourth conductive portion 14c extend along the second direction (e.g., the Y-axis direction). The one end portion 11ne of the first connection portion 11n is fixed to the first fixed portion 11f. The other end portion 11nf of the first connection portion 11n is connected to the one end portion 11ce of the first conductive portion 11c and one end portion 14ce of the fourth conductive portion 14c. The sensor 110 is, for example, a torsion-type MEMS sensor.

As shown in FIG. 2, the sensor 110 may include a first electrode pad 11E, a second electrode pad 12E, and a third electrode pad 13E. For example, the first electrode pad 11E is electrically connected to the first conductive portion 11c. In the example, the first electrode pad 11E is electrically connected to the first conductive portion 11c via the first fixed portion 11f. For example, the second electrode pad 12E is electrically connected to the second conductive portion 12c. For example, the third electrode pad 13E is electrically connected to the third conductive portion 13c.

For example, the change of the electrostatic capacitance between the multiple first electrodes 11e and the multiple second electrodes 12e can be known by detecting an electrical characteristic (e.g., a voltage, etc.) between the first electrode pad 11E and the second electrode pad 12E. For example, the change of the electrostatic capacitance between the multiple fourth electrodes 14e and the multiple third electrodes 13e can be known by detecting an electrical characteristic (e.g., a voltage, etc.) between the first electrode pad 11E and the third electrode pad 13E.

Second Embodiment

FIG. 3A to FIG. 3C, FIG. 4A, and FIG. 4B are schematic views illustrating a sensor according to a second embodiment.

Figure 3A:
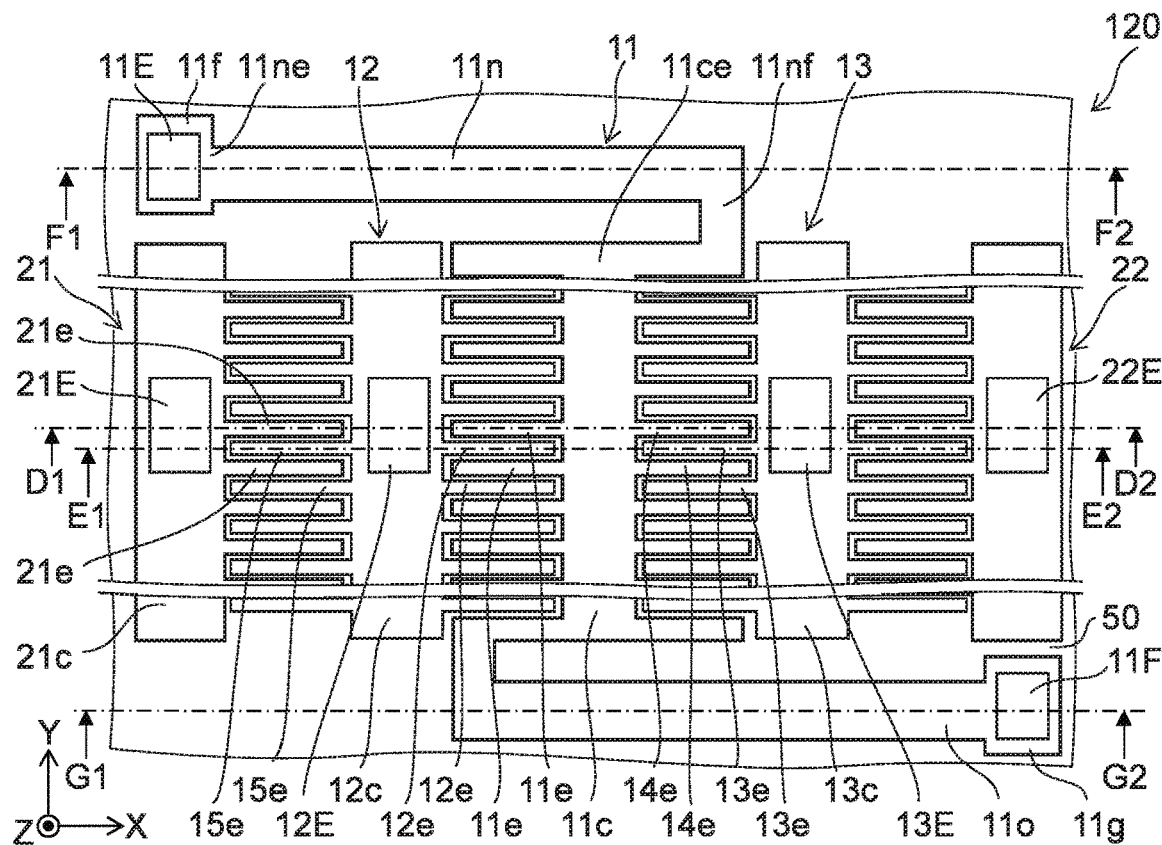
FIG. 3A to FIG. 3C are schematic views illustrating a sensor according to a second embodiment.
Figure 3B:
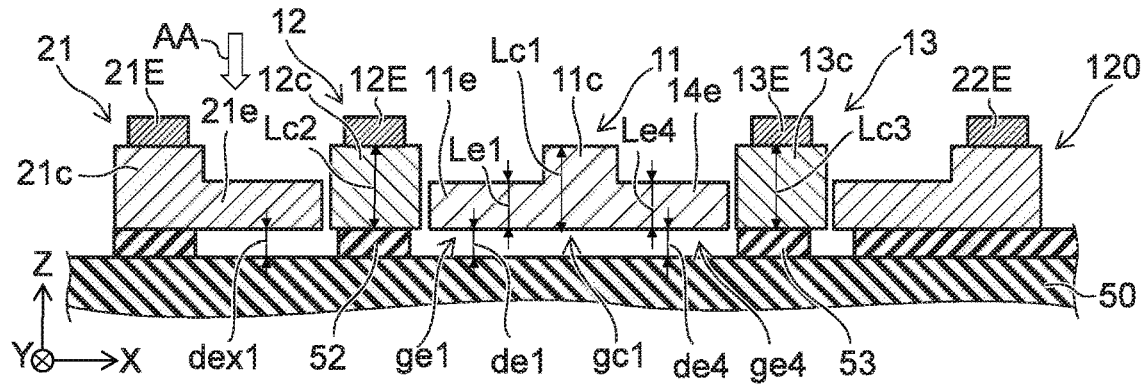
Figure 3C:
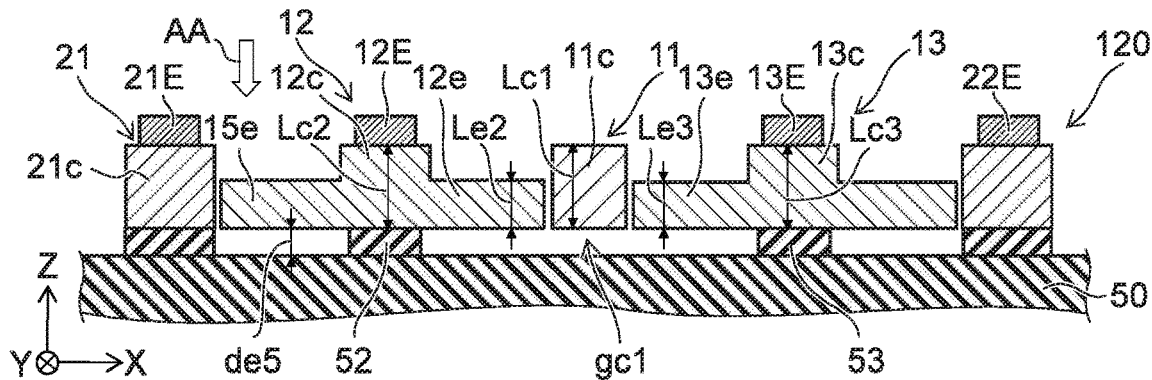
Figure 4A:
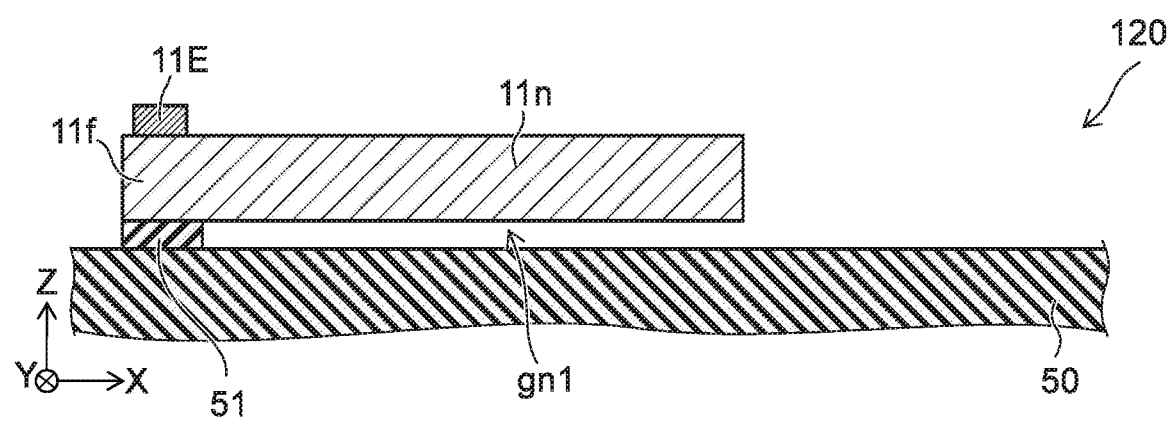
FIG. 4A, and FIG. 4B are schematic views illustrating the sensor according to the second embodiment.
Figure 4B:
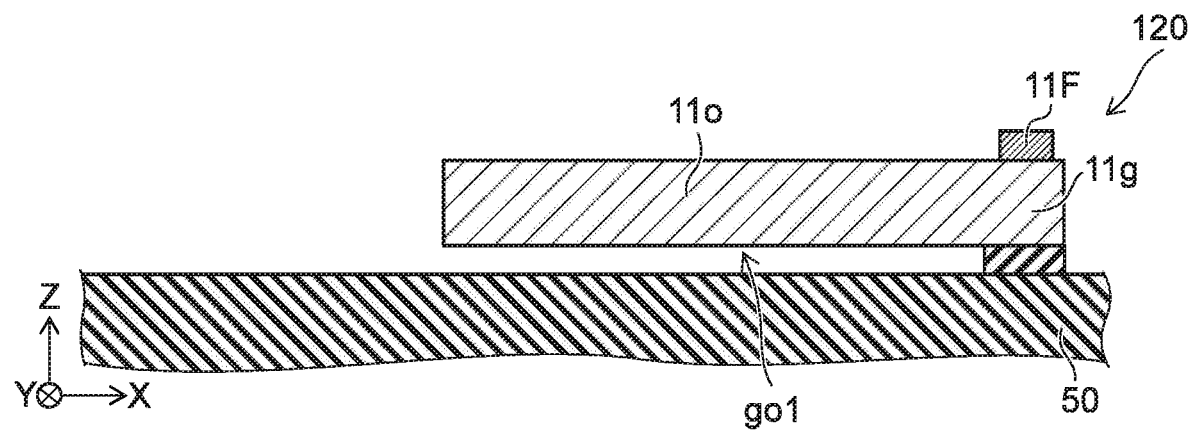

FIG. 3A is a plan view as viewed along arrow AA of FIG. 3B and FIG. 3C. FIG. 3B is a line D1-D2 cross-sectional view of FIG. 3A. FIG. 3C is a line E1-E2 cross-sectional view of FIG. 3A. FIG. 4A is a line F1-F2 cross-sectional view of FIG. 3A. FIG. 4B is a line G1-G2 cross-sectional view of FIG. 3A.

As shown in FIG. 3A, the sensor 120 also includes the base body 50, the first structure body 11, and the second structure body 12.

The first structure body 11 includes the first fixed portion 11f, the first conductive portion 11c, and the multiple first electrodes 11e. As shown in FIG. 4A, the first fixed portion 11f is fixed to the base body 50. In the example, the first fixed portion 11f is fixed to the base body 50 via the first insulating portion 51. As shown in FIG. 3A, the first conductive portion 11c is held by the first fixed portion 11f. As shown in FIG. 3B, the first conductive portion 11c is separated from the base body 50 in the first direction (e.g., the Z-axis direction). The gap gc1 is formed between the first conductive portion 11c and the base body 50. As shown in FIG. 3A, the multiple first electrodes 11e are held by the first conductive portion 11c. For example, the first conductive portion 11c is connected to the first fixed portion 11f. As shown in FIG. 3B, the gap ge1 is formed between the base body 50 and the multiple first electrodes 11e. The distance de1 between the base body 50 and the multiple first electrodes 11e is changeable. As shown in FIG. 3A, the direction from one of the multiple first electrodes 11e toward another one of the multiple first electrodes 11e is along the second direction. The second direction crosses the first direction. The second direction is, for example, the Y-axis direction.

As shown in FIG. 3A, the second structure body 12 includes the second conductive portion 12c and the multiple second electrodes 12e. As shown in FIG. 3C, the second conductive portion 12c is fixed to the base body 50. In the example, the second conductive portion 12c is fixed to the base body 50 via the second insulating portion 52. As shown in FIG. 3A, the multiple second electrodes 12e are held by the second conductive portion 12c. For example, the multiple second electrodes 12e are connected to the second conductive portion 12c. One of the multiple second electrodes 12e is between the one of the multiple first electrodes 11e and the other one of the multiple first electrodes 11e.

In the example as well, as shown in FIG. 3A, the first electrode length Le1 along the first direction (the Z-axis direction) of one of the multiple first electrodes 11e is shorter than the first conductive portion length Lc1 along the first direction of the first conductive portion 11c. The initial capacitance C0 can be reduced thereby. High sensitivity is obtained thereby.

For example, as shown in FIG. 3C, the second electrode length Le1 along the first direction of one of the multiple second electrodes 12e is shorter than the second conductive portion length Lc2 along the first direction of the second conductive portion 12c. The initial capacitance C0 can be reduced thereby. High sensitivity is obtained thereby.

The sensor 120 is, for example, a beam spring-type. As shown in FIG. 3A, the first structure body 11 includes the first connection portion 11n. The first connection portion 11n connects the first fixed portion 11f and the first conductive portion 11c. In the example, the first structure body 11 further includes a second fixed portion 11g and a second connection portion 11o. As shown in FIG. 4B, the second fixed portion 11g is fixed to the base body 50. A gap go1 is provided between the second fixed portion 11g and the base body 50. As shown in FIG. 3A, the second connection portion 11o connects the second fixed portion 11g and the first conductive portion 11c. The first connection portion 11n and the second connection portion 11o are, for example, beam springs.

As shown in FIG. 4A, the first connection portion 11n is separated from the base body 50 in the first direction (the Z-axis direction). As shown in FIG. 3A, the first conductive portion 11c extends along the second direction (e.g., the Y-axis direction). The one end portion 11ne of the first connection portion 11n is fixed to the first fixed portion 11f. The other end portion 11nf of the first connection portion 11n is connected to the one end portion 11ce of the first conductive portion 11c.

Similarly, as shown in FIG. 4B, the second connection portion 11o is separated from the base body 50 in the first direction (the Z-axis direction). One end portion of the second connection portion 11o is fixed to the first fixed portion 11f. Another end portion of the second connection portion 11o is connected to another end portion of the first conductive portion 11c.

As shown in FIG. 3A, the sensor 120 may include the third structure body 13. The third structure body 13 includes the third conductive portion 13c and the multiple third electrodes 13e. As shown in FIG. 3C, the third conductive portion 13c is fixed to the base body 50. In the example, the third conductive portion 13c is fixed to the base body 50 via the third insulating portion 53. As shown in FIG. 3A, the multiple third electrodes 13e are held by the third conductive portion 13c. For example, the multiple third electrodes 13e are connected to the third conductive portion 13c.

As shown in FIG. 3A, the first structure body 11 includes the multiple fourth electrodes 14e. The multiple fourth electrodes 14e are held by the first conductive portion 11c. For example, the multiple fourth electrodes 14e are connected to the first conductive portion 11c. As shown in FIG. 3B, the gap ge4 is provided between the base body 50 and the multiple fourth electrodes 14e. The distance de4 between the base body 50 and the multiple fourth electrodes 14e is changeable. As shown in FIG. 3A, the direction from one of the multiple fourth electrodes 14e toward another one of the multiple fourth electrodes 14e is along the second direction (e.g., the Y-axis direction).

The first conductive portion 11c is between the second conductive portion 12c and the third conductive portion 13c in the third direction (e.g., the X-axis direction) crossing a plane including the first direction and the second direction. The first conductive portion 11c is between the multiple first electrodes 11e and the multiple fourth electrodes 14e in the third direction (e.g., the X-axis direction). As shown in FIG. 3A, one of the multiple third electrodes 13e is between the one of the multiple fourth electrodes 14e and the other one of the multiple fourth electrodes 14e. The one of the multiple fourth electrodes 14e is between the one of the multiple third electrodes 13e and another one of the multiple third electrodes 13e. A comb electrode is formed of the multiple third electrodes 13e and the multiple fourth electrodes 14e.

As shown in FIG. 3C, the third electrode length Le3 along the first direction (the Z-axis direction) of one of the multiple third electrodes 13e is shorter than the third conductive portion length Lc3 along the first direction of the third conductive portion 13c. The initial capacitance C0 can be reduced thereby. High sensitivity is obtained thereby.

As shown in FIG. 3B, the fourth electrode length Le4 along the first direction of one of the multiple fourth electrodes 14e is shorter than the first conductive portion length Lc1. The initial capacitance C0 can be reduced thereby. High sensitivity is obtained thereby.

For example, the first electrode length Le1 is not less than 1/10 and not more than 9/10 of the first conductive portion length Lc1. For example, the second electrode length Let is not less than 1/10 and not more than 9/10 of the second conductive portion length Lc2.

As shown in FIG. 3A, the sensor 120 may further include a first fixed structure body 21. The first fixed structure body 21 includes a first fixed conductive portion 21c and multiple first fixed electrodes 21e. As shown in FIG. 3B, the first fixed conductive portion 21c is fixed to the base body 50. As shown in FIG. 3A, the multiple first fixed electrodes 21e is held by the first fixed conductive portion 21c. For example, the multiple first fixed electrodes 21e is connected to the first fixed conductive portion 21c.

As shown in FIG. 3A, the second structure body 12 includes multiple fifth electrodes 15e. The multiple fifth electrodes 15e are held by the second conductive portion 12c. For example, the multiple fifth electrodes 15e are connected to the second conductive portion 12c. The direction from one of the multiple fifth electrodes 15e toward another one of the multiple fifth electrodes 15e is along the second direction (e.g., the Y-axis direction).

The second conductive portion 12c is between the first fixed conductive portion 21c and the first conductive portion 11c in the third direction (e.g., the X-axis direction) crossing a plane including the first direction and the second direction. The second conductive portion 12c is between the multiple fifth electrodes 15e and the multiple second electrodes 12e in the third direction. One of the multiple first fixed electrodes 21e is between the one of the multiple fifth electrodes 15e and the other one of the multiple fifth electrodes 15e. The one of the multiple fifth electrodes 15e is between the one of the multiple first fixed electrodes 21e and another one of the multiple first fixed electrodes 21e. A comb electrode is formed of the multiple first fixed electrodes 21e and the multiple fifth electrodes 15e.

For example, a distance dex1 between the base body 50 and the multiple first fixed electrodes 21e (referring to FIG. 3B) is substantially fixed. For example, a distance de5 between the base body 50 and the multiple fifth electrodes 15e (referring to FIG. 3C) is substantially fixed. The electrostatic capacitance of the capacitance formed by the multiple first fixed electrodes 21e and the multiple fifth electrodes 15e also substantially does not change when the external force is applied.

For example, the electrostatic capacitance between the multiple first fixed electrodes 21e and the multiple fifth electrodes 15e may be used as a reference value. For example, the detection is performed using the difference between the electrostatic capacitance between the multiple first fixed electrodes 21e and the multiple fifth electrodes 15e and the electrostatic capacitance between the multiple first electrodes 11e and the multiple second electrodes 12e. Thereby, the detection can be performed with higher accuracy.

A second fixed structure body 22 can have a configuration similar to that of the first fixed structure body 21. A comb electrode is formed of the multiple electrodes provided in the second fixed structure body 22 and the multiple electrodes provided in the third structure body 13. For example, the detection is performed using the difference between the electrostatic capacitance of the comb electrode and the electrostatic capacitance between the multiple fourth electrodes 14e and the multiple third electrodes 13e. Thereby, the detection can be performed with higher accuracy.

For example, the sensor 120 may include the first electrode pad 11E, the second electrode pad 12E, the third electrode pad 13E, an electrode pad 11F, an electrode pad 21E, and an electrode pad 22E. For example, the first electrode pad 11E is electrically connected to the first conductive portion 11c. In the example, the first electrode pad 11E and the electrode pad 11F are electrically connected to the first conductive portion 11c. For example, the second electrode pad 12E is electrically connected to the second conductive portion 12c. For example, the third electrode pad 13E is electrically connected to the third conductive portion 13c. The electrode pad 21E is electrically connected to the multiple first fixed electrodes 21e. The electrode pad 22E is electrically connected to the multiple electrodes included in the second fixed structure body 22. The external force or the like can be detected by detecting the electrical characteristics between these electrode pads.

In the embodiment recited above, for example, the base body 50 includes silicon. The multiple electrodes (the multiple first electrodes 11e, the multiple second electrodes 12e, the multiple third electrodes 13e, the multiple fourth electrodes 14e, the multiple fifth electrodes 15e, the multiple first fixed electrodes 21e, etc.) include, for example, silicon and a first element. The first element includes, for example, at least one selected from the group consisting of germanium, phosphorus, arsenic, antimony, boron, gallium, and indium. The first element is, for example, an impurity.

The embodiments may include the following configurations (e.g., technological proposals).

Configuration 1

A sensor, comprising:
a base body;
a first structure body, the first structure body including a first fixed portion, a first conductive portion, and a plurality of first electrodes, the first fixed portion being fixed to the base body, the first conductive portion being held by the first fixed portion, the first conductive portion being separated from the base body in a first direction, the plurality of first electrodes being held by the first conductive portion, a distance between the base body and the plurality of first electrodes being changeable, a direction from one of the plurality of first electrodes toward an other one of the plurality of first electrodes being along a second direction crossing the first direction; and
a second structure body, the second structure body including a second conductive portion and a plurality of second electrodes, the second conductive portion being fixed to the base body, the plurality of second electrodes being held by the second conductive portion, one of the plurality of second electrodes being between the one of the plurality of first electrodes and the other one of the plurality of first electrodes,
a first electrode length along the first direction of the one of the plurality of first electrodes being shorter than a first conductive portion length along the first direction of the first conductive portion.

Configuration 2

The sensor according to Configuration 1, wherein a second electrode length along the first direction of the one of the plurality of second electrodes is shorter than a second conductive portion length along the first direction of the second conductive portion.

Configuration 3

The sensor according to Configuration 2, wherein
the first electrode length is shorter than the second conductive portion length, and
the second electrode length is shorter than the first conductive portion length.

Configuration 4

The sensor according to any one of Configurations 1 to 3, wherein the first electrode length is not less than 1/10 and not more than 9/10 of the first conductive portion length.

Configuration 5

A sensor, comprising:
a base body;
a first structure body, the first structure body including a first fixed portion, a first conductive portion, and a plurality of first electrodes, the first fixed portion being fixed to the base body, the first conductive portion being held by the first fixed portion, the first conductive portion being separated from the base body in a first direction, the plurality of first electrodes being held by the first conductive portion, a distance between the base body and the plurality of first electrodes being changeable, a direction from one of the plurality of first electrodes toward an other one of the plurality of first electrodes being along a second direction crossing the first direction; and
a second structure body, the second structure body including a second conductive portion and a plurality of second electrodes, the second conductive portion being fixed to the base body, the plurality of second electrodes being held by the second conductive portion, one of the plurality of second electrodes being between the one of the plurality of first electrodes and the other one of the plurality of first electrodes,
a second electrode length along the first direction of the one of the plurality of second electrodes being shorter than a second conductive portion length along the first direction of the second conductive portion.

Configuration 6

The sensor according to any one of Configurations 2 to 4, wherein the second electrode length is not less than 1/10 and not more than 9/10 of the second conductive portion length.

Configuration 7

The sensor according to any one of Configurations 1 to 6, wherein
the first structure body further includes a first connection portion connecting the first fixed portion and the first conductive portion,
the first connection portion is separated from the base body in the first direction,
the first connection portion and the first conductive portion extend along the second direction,
one end portion of the first connection portion is fixed to the first fixed portion, and
an other end portion of the first connection portion is connected to one end portion of the first conductive portion.

Configuration 8

The sensor according to any one of Configurations 1 to 6, further comprising a third structure body, the third structure body including a third conductive portion and a plurality of third electrodes, the third conductive portion being fixed to the base body, the plurality of third electrodes being held by the third conductive portion,
the first structure body including a fourth conductive portion and a plurality of fourth electrodes, the fourth conductive portion being held by the first fixed portion, the fourth conductive portion being separated from the base body in the first direction, the plurality of fourth electrodes being held by the fourth conductive portion, a distance between the base body and the plurality of fourth electrodes being changeable, a direction from one of the plurality of fourth electrodes toward an other one of the plurality of fourth electrodes being along the second direction,
one of the plurality of third electrodes being between the one of the plurality of fourth electrodes and the other one of the plurality of fourth electrodes,
a third electrode length along the first direction of the one of the plurality of third electrodes being shorter than a third conductive portion length along the first direction of the third conductive portion.

Configuration 9

The sensor according to Configuration 8, wherein a fourth electrode length along the first direction of the one of the plurality of fourth electrodes is shorter than a fourth conductive portion length along the first direction of the fourth conductive portion.

Configuration 10

The sensor according to Configuration 8 or 9, wherein the first conductive portion is between the second conductive portion and the third conductive portion in a third direction crossing a plane including the first direction and the second direction, and the fourth conductive portion is between the first conductive portion and the third conductive portion in the third direction.

Configuration 11

The sensor according to Configuration 8 or 9, wherein a first conductive portion width of the first conductive portion along a third direction is different from a fourth conductive portion width of the fourth conductive portion along the third direction, the third direction crossing a plane including the first direction and the second direction.

Configuration 12

The sensor according to any one of Configurations 8 to 11, wherein the first structure body further includes a first connection portion connecting the first fixed portion and the first conductive portion, the first connection portion is separated from the base body in the first direction, the first connection portion, the first conductive portion, and the fourth conductive portion extend along the second direction, one end portion of the first connection portion is fixed to the first fixed portion, and an other end portion of the first connection portion is connected to one end portion of the first conductive portion and one end portion of the fourth conductive portion.

Configuration 13

The sensor according to any one of Configurations 1 to 6, wherein the first structure body further includes a first connection portion connecting the first fixed portion and the first conductive portion, the first connection portion is separated from the base body in the first direction, the first conductive portion extends along the second direction, one end portion of the first connection portion is fixed to the first fixed portion, and an other end portion of the first connection portion is connected to one end portion of the first conductive portion.

Configuration 14

The sensor according to any one of Configurations 1 to 6, further comprising a third structure body, the third structure body including a third conductive portion and a plurality of third electrodes, the third conductive portion being fixed to the base body, the plurality of third electrodes being held by the third conductive portion, the first structure body including a plurality of fourth electrodes, the plurality of fourth electrodes being held by the first conductive portion, a distance between the base body and the plurality of fourth electrodes being changeable, a direction from one of the plurality of fourth electrodes toward an other one of the plurality of fourth electrodes being along the second direction, the first conductive portion being between the second conductive portion and the third conductive portion in a third direction, the third direction crossing a plane including the first direction and the second direction, the first conductive portion being between the plurality of first electrodes and the plurality of fourth electrodes in the third direction, one of the plurality of third electrodes being between the one of the plurality of fourth electrodes and the other one of the plurality of fourth electrodes, a third electrode length along the first direction of the one of the plurality of third electrodes being shorter than a third conductive portion length along the first direction of the third conductive portion.

Configuration 15

The sensor according to Configuration 14, wherein a fourth electrode length along the first direction of the one of the plurality of fourth electrodes is shorter than the first conductive portion length.

Configuration 16

The sensor according to any one of Configurations 8 to 15, further comprising a first fixed structure body, the first fixed structure body including a first fixed conductive portion and a plurality of first fixed electrodes, the first fixed conductive portion being fixed to the base body, the plurality of first fixed electrodes being held by the first fixed conductive portion, the second structure body including a plurality of fifth electrodes, the plurality of fifth electrodes being held by the second conductive portion, a direction from one of the plurality of fifth electrodes toward an other one of the plurality of fifth electrodes being along the second direction, the second conductive portion being between the first fixed conductive portion and the first conductive portion in a third direction, the third direction crossing a plane including the first direction and the second direction, the second conductive portion being between the plurality of fifth electrodes and the plurality of second electrodes in the third direction, one of the plurality of first fixed electrodes being between the one of the plurality of fifth electrodes and the other one of the plurality of fifth electrodes.

Configuration 17

The sensor according to Configuration 16, wherein a distance between the base body and the plurality of first fixed electrodes is substantially fixed, and a distance between the base body and the plurality of fifth electrodes is substantially fixed.

Configuration 18

The sensor according to any one of Configurations 1 to 17, further comprising a first insulating portion and a second insulating portion, the first insulating portion being provided between the base body and the first fixed portion, the second insulating portion being provided between the base body and the second conductive portion.

Configuration 19

The sensor according to any one of Configurations 1 to 18, wherein the base body includes silicon, the plurality of first electrodes and the plurality of second electrodes include silicon and a first element, and the first element includes at least one selected from the group consisting of germanium, phosphorus, arsenic, antimony, boron, gallium, and indium.

Configuration 20

The sensor according to any one of Configurations 1 to 19, wherein an electrostatic capacitance between the plurality of first electrodes and the plurality of second electrodes changes according to a change of the distance between the base body and the plurality of first electrodes.

According to the embodiments, a sensor can be provided in which the sensitivity can be increased.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in sensors such as base bodies, structure bodies, conductive portions, electrodes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors practicable by an appropriate design modification by one skilled in the art based on the sensors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensor, comprising:
a base body;
a first structure body, the first structure body including a first fixed portion, a first conductive portion, and a plurality of first electrodes, the first fixed portion being fixed to the base body, the first conductive portion being held by the first fixed portion, the first conductive portion being separated from the base body in a first direction, the plurality of first electrodes being held by the first conductive portion, a distance between the base body and the plurality of first electrodes being changeable, a direction from one of the plurality of first electrodes toward an other one of the plurality of first electrodes being along a second direction crossing the first direction;
a second structure body, the second structure body including a second conductive portion and a plurality of second electrodes, the second conductive portion being fixed to the base body, the plurality of second electrodes being held by the second conductive portion, one of the plurality of second electrodes being between the one of the plurality of first electrodes and the other one of the plurality of first electrodes,
a first electrode length along the first direction of the one of the plurality of first electrodes being shorter than a first conductive portion length along the first direction of the first conductive portion.

2. The sensor according to claim 1, wherein a second electrode length along the first direction of the one of the plurality of second electrodes is shorter than a second conductive portion length along the first direction of the second conductive portion.

3. The sensor according to claim 2, wherein
the first electrode length is shorter than the second conductive portion length, and
the second electrode length is shorter than the first conductive portion length.

4. The sensor according to claim 1, wherein the first electrode length is not less than $1/10$ and not more than $9/10$ of the first conductive portion length.

5. A sensor, comprising:
a base body;
a first structure body, the first structure body including a first fixed portion, a first conductive portion, and a plurality of first electrodes, the first fixed portion being fixed to the base body, the first conductive portion being held by the first fixed portion, the first conductive portion being separated from the base body in a first direction, the plurality of first electrodes being held by the first conductive portion, a distance between the base body and the plurality of first electrodes being changeable, a direction from one of the plurality of first electrodes toward an other one of the plurality of first electrodes being along a second direction crossing the first direction; and
a second structure body, the second structure body including a second conductive portion and a plurality of second electrodes, the second conductive portion being fixed to the base body, the plurality of second electrodes being held by the second conductive portion, one of the plurality of second electrodes being between the one of the plurality of first electrodes and the other one of the plurality of first electrodes,
a second electrode length along the first direction of the one of the plurality of second electrodes being shorter than a second conductive portion length along the first direction of the second conductive portion.

6. The sensor according to claim 2, wherein the second electrode length is not less than $1/10$ and not more than $9/10$ of the second conductive portion length.

7. The sensor according to claim 1, wherein
the first structure body further includes a first connection portion connecting the first fixed portion and the first conductive portion,
the first connection portion is separated from the base body in the first direction,
the first connection portion and the first conductive portion extend along the second direction,
one end portion of the first connection portion is fixed to the first fixed portion, and
an other end portion of the first connection portion is connected to one end portion of the first conductive portion.

8. The sensor according to claim 1, further comprising a third structure body, the third structure body including a third conductive portion and a plurality of third electrodes, the third conductive portion being fixed to the base body, the plurality of third electrodes being held by the third conductive portion,
the first structure body including a fourth conductive portion and a plurality of fourth electrodes, the fourth conductive portion being held by the first fixed portion, the fourth conductive portion being separated from the base body in the first direction, the plurality of fourth electrodes being held by the fourth conductive portion, a distance between the base body and the plurality of fourth electrodes being changeable, a direction from one of the plurality of fourth electrodes toward an other one of the plurality of fourth electrodes being along the second direction, one of the plurality of third electrodes being between the one of the plurality of fourth electrodes and the other one of the plurality of fourth electrodes, a third electrode length along the first direction of the one of the plurality of third electrodes being shorter than a third conductive portion length along the first direction of the third conductive portion.

9. The sensor according to claim 8, wherein a fourth electrode length along the first direction of the one of the plurality of fourth electrodes is shorter than a fourth conductive portion length along the first direction of the fourth conductive portion.

10. The sensor according to claim 8, wherein
the first conductive portion is between the second conductive portion and the third conductive portion in a third direction crossing a plane including the first direction and the second direction, and
the fourth conductive portion is between the first conductive portion and the third conductive portion in the third direction.

11. The sensor according to claim 8, wherein a first conductive portion width of the first conductive portion along a third direction is different from a fourth conductive portion width of the fourth conductive portion along the third direction, the third direction crossing a plane including the first direction and the second direction.

12. The sensor according to claim 8, wherein
the first structure body further includes a first connection portion connecting the first fixed portion and the first conductive portion,
the first connection portion is separated from the base body in the first direction,
the first connection portion, the first conductive portion, and the fourth conductive portion extend along the second direction,
one end portion of the first connection portion is fixed to the first fixed portion, and
an other end portion of the first connection portion is connected to one end portion of the first conductive portion and one end portion of the fourth conductive portion.

13. The sensor according to claim 1, wherein
the first structure body further includes a first connection portion connecting the first fixed portion and the first conductive portion,
the first connection portion is separated from the base body in the first direction,
the first conductive portion extends along the second direction,
one end portion of the first connection portion is fixed to the first fixed portion, and
an other end portion of the first connection portion is connected to one end portion of the first conductive portion.

14. The sensor according to claim 1, further comprising a third structure body, the third structure body including a third conductive portion and a plurality of third electrodes, the third conductive portion being fixed to the base body, the plurality of third electrodes being held by the third conductive portion,
the first structure body including a plurality of fourth electrodes, the plurality of fourth electrodes being held by the first conductive portion, a distance between the base body and the plurality of fourth electrodes being changeable, a direction from one of the plurality of fourth electrodes toward an other one of the plurality of fourth electrodes being along the second direction, the first conductive portion being between the second conductive portion and the third conductive portion in a third direction, the third direction crossing a plane including the first direction and the second direction, the first conductive portion being between the plurality of first electrodes and the plurality of fourth electrodes in the third direction, one of the plurality of third electrodes being between the one of the plurality of fourth electrodes and the other one of the plurality of fourth electrodes, a third electrode length along the first direction of the one of the plurality of third electrodes being shorter than a third conductive portion length along the first direction of the third conductive portion.

15. The sensor according to claim 14, wherein a fourth electrode length along the first direction of the one of the plurality of fourth electrodes is shorter than the first conductive portion length.

16. The sensor according to claim 8, further comprising a first fixed structure body,
the first fixed structure body including a first fixed conductive portion and a plurality of first fixed electrodes, the first fixed conductive portion being fixed to the base body, the plurality of first fixed electrodes being held by the first fixed conductive portion,
the second structure body including a plurality of fifth electrodes, the plurality of fifth electrodes being held by the second conductive portion, a direction from one of the plurality of fifth electrodes toward an other one of the plurality of fifth electrodes being along the second direction,
the second conductive portion being between the first fixed conductive portion and the first conductive portion in a third direction, the third direction crossing a plane including the first direction and the second direction,
the second conductive portion being between the plurality of fifth electrodes and the plurality of second electrodes in the third direction,
one of the plurality of first fixed electrodes being between the one of the plurality of fifth electrodes and the other one of the plurality of fifth electrodes.

17. The sensor according to claim 16, wherein
a distance between the base body and the plurality of first fixed electrodes is substantially fixed, and
a distance between the base body and the plurality of fifth electrodes is substantially fixed.

18. The sensor according to claim 1, further comprising a first insulating portion and a second insulating portion,
the first insulating portion being provided between the base body and the first fixed portion,
the second insulating portion being provided between the base body and the second conductive portion.

19. The sensor according to claim 1, wherein
the base body includes silicon,
the plurality of first electrodes and the plurality of second electrodes include silicon and a first element,
the first element including at least one selected from the group consisting of germanium, phosphorus, arsenic, antimony, boron, gallium, and indium.

20. The sensor according to claim 1, wherein an electrostatic capacitance between the plurality of first electrodes and the plurality of second electrodes changes according to a change of the distance between the base body and the plurality of first electrodes.

\* \* \* \* \*